(12) United States Patent
Allen

(10) Patent No.: US 8,149,148 B1
(45) Date of Patent: Apr. 3, 2012

(54) LOCAL BINARY XML STRING COMPRESSION

(75) Inventor: Nicholas Allen, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 43 days.

(21) Appl. No.: 12/901,328

(22) Filed: Oct. 8, 2010

(51) Int. Cl.
*H03M 7/00* (2006.01)

(52) U.S. Cl. .......................................... 341/106; 341/65

(58) Field of Classification Search ................ 341/65, 341/106, 51, 64
See application file for complete search history.

(56) References Cited

U.S. PATENT DOCUMENTS

| | | | | |
|---|---|---|---|---|
| 6,304,601 | B1 * | 10/2001 | Davison | 375/240 |
| 6,635,088 | B1 | 10/2003 | Hind et al. | |
| 6,670,897 | B1 * | 12/2003 | Lin | 341/65 |
| 7,441,185 | B2 | 10/2008 | Coulson et al. | |
| 7,500,017 | B2 | 3/2009 | Cseri et al. | |
| 7,539,776 | B1 * | 5/2009 | Saare et al. | 709/247 |
| 7,664,880 | B2 | 2/2010 | Allen et al. | |
| 2006/0085737 | A1 | 4/2006 | Liu | |
| 2008/0281920 | A1 | 11/2008 | Rosu | |
| 2010/0010995 | A1 | 1/2010 | Fablet et al. | |
| 2010/0070540 | A1 * | 3/2010 | Danial | 707/803 |

OTHER PUBLICATIONS

Harrusi, et al., "Compact XML grammar based compression", Retrieved at <<http://www.cs.tau.ac.il/~amir1/PS/XML-compression.pdf>>, pp. 1-37.

"Efficient XML Interchange (EXI) Format 1.0", Retrieved at <<http://www.w3.org/TR/2007/WD-exi-20070716/#compression>>, Editors: John Schneider and Takuki Kamiya, Retrieved Date: Jul. 27, 2010, pp. 46.

Sakr, Sherif., "XML compression techniques: A survey and comparison", Retrieved at <<http://www.msit2005.mut.ac.th/msit_media/1_2552/ITEC0950/Materials/20090741934110X.pdf>>, Journal of Computer and System Sciences, vol. 75, No. 5, Aug. 2009, pp. 303-322.

Rodriguez, Stephanie., "XML optimization", Retrieved at <<http://www.codeproject.com/KB/cpp/betterxml.aspx?msg=588052>>, Sep. 11, 2002, pp. 12.

Liefke, Hartmut., "Free Tool for Efficient XML Data Compression", Retrieved at <<http://www.stylusstudio.com/xmldev/199912/post50640.html>>, Dec. 18, 1999, pp. 2.

"Information technology—Generic applications of ASN.1: Fast infoset security", Retrieved at <<http://webstore.iec.ch/preview/info_isoiec24824-3%7Bed1.0%7Den.pdf>>, 2008, pp. 8.

"[MC-NBSFSE]: .NET Binary Format: SOAP Extension", Retrieved at <<http://msdn.microsoft.com/en-us/library/cc219190(PROT.10).aspx>>, Aug. 20, 2010, pp. 14.

* cited by examiner

*Primary Examiner* — Brian Young
(74) *Attorney, Agent, or Firm* — Ogilvie Law Firm

(57) ABSTRACT

Targeted compression of strings is provided for XML and other documents using local tables whose scope need not align with syntactically well-formed document regions. The local table's scope is fixed (not sliding), and may be nested within other local table scopes. A string is nominated for inclusion, and record(s) are inserted in a document encoding to effect the nomination. The nominated string is placed in the local table in correspondence with a token identifier. During compression, reference(s) to the string's token identifier are included in the document encoding; during decompression the references are replaced by the string. The local table is deleted at the end of its scope. Tables may have multiple channels, with nominated strings placed in a channel based on frequency of references to the strings. The document encoding may include the local table(s), static table(s), and dynamic table(s) in a flat token value space.

19 Claims, 4 Drawing Sheets

| | | | | |
|---|---|---|---|---|
| 1 | START ELEMENT #1 | PUSH SCOPE | PUSH NEXT STRING | START ELEMENT "CHEDDAR" |
| 5 | PUSH STRING "GOUDA" | PUSH STRING "SWISS" | ADD ATTRIBUTE #4 "YELLOW" | END ELEMENT |
| 9 | PUSH SCOPE | PUSH STRING "YELLOW" | PUSH STRING "WHITE" | PUSH SCOPE |
| 13 | PUSH STRING "3 MONTHS" | PUSH STRING "6 MONTHS" | START ELEMENT #2 | ADD ATTRIBUTE #4 #14 |
| 17 | ADD ATTRIBUTE #7 #17 | END ELEMENT | POP SCOPE | POP SCOPE |
| 21 | START ELEMENT #5 | END ELEMENT | END ELEMENT | |

Fig. 5

LOCAL BINARY XML STRING COMPRESSION

BACKGROUND

In computer science, compression is the practice of representing data in a more compact form by reducing the amount of redundant information that is included when data is stored or communicated. Lossless compression is a kind of compression in which the original data can be exactly recovered from the compressed data, that is, from the data in the reduced format. Lossless compression can be useful when even small changes to the data may significantly change the meaning of the data.

Various resource tradeoffs may arise in conjunction with compression. For example, significant gains in coding efficiency (that is, in the relative reduction in size of the data) may require inordinate expenditures of limited computational resources. More generally, the various advantages and costs of compression can be viewed in a context of overall resources and objectives that varies according to the circumstances.

Compression may be applied to various kinds of data. In particular, compression may be applied to structured documents which are normally human-legible, such as XML documents. XML provides a set of rules for the electronic encoding of documents, which are sometimes used in protocols for exchanging structured information in the implementation of web services, for example. Lossless compression may allow such documents to be exchanged with improved coding efficiency and without changing their meaning. Strings are often one of the predominant variable-length features in an encoded XML document. In general, predominance indicates that compression of some kind may be worth considering. As with compression generally, however, the resources and objectives of XML document compression may differ according to the circumstances, so having a variety of possible approaches can be helpful.

SUMMARY

Strings are one of the predominant variable-length features in an encoded document. Targeted compression of strings can improve coding efficiency when coding can be done without a significant increase in required memory or other computational resources.

Some embodiments described herein provide compression and/or decompression using local table(s) for strings, possibly in addition to familiar static table(s) and/or dynamic table(s). Unlike static tables and dynamic tables, local tables can have a lifespan which does not necessarily coincide with the processing of a syntactically well-formed portion of an XML document, and which is a proper subset of the overall compression/decompression period for a document.

In some embodiments, a local table having spaces allocated for holding a plurality of strings is created. String tokens may be read while parsing an XML document or other document that is being encoded, for example. A string is nominated for inclusion in the local table, and record(s) are inserted in a document encoding to effect the nomination. After obtaining a token identifier, the nominated string is placed in the local table in correspondence with the token identifier. During compression, reference(s) to the string's token identifier are included in the document encoding, rather than including the string itself; during decompression the references are replaced by the string. The local table is deleted when the end of its document region is reached, which occurs in some embodiments before the document is fully compressed/fully decompressed.

In some embodiments, the local table may have multiple channels, with nominated strings placed in a selected channel based in part on an expected frequency of references to the nominated string. In some, records of one or more types can be inserted in the document encoding to effect the nomination of a string. Some examples include a record nominating a string that is recited in that record, a record nominating the next string seen, a record nominating the most recently seen string, a record nominating all of the string(s) used by the next record, a record nominating all of the string(s) used by the previous record, and a record for nominating a string and contemporaneously performing an encoding/decoding action (e.g., starting or ending an XML element, adding an XML attribute).

In some embodiments, a memory is in operable communication with a logical processor. A document encoding configures the memory; a compressor, decompressor, and token identifier generator may also configure the memory. Within the encoding, records present include at least one local string nomination region record nominating a fixed position local region of the records as a region within which a local table of strings is alive. The local region (scope) is smaller than the entire document encoding, and is fixed in position relative to an initial record of the document(s) rather than sliding. The records also include at least one string nomination record within the local region which nominates a string for inclusion in the local table, and at least one local string reference record containing a token identifier which identifies an entry of the local string table.

In some embodiments, the document encoding includes the local table, a static table, and a dynamic table, in a flat token value space. In some, the document encoding includes multiple channels (in one or more tables) in a partitioned identifier space. In some embodiments, the document encoding includes hierarchically nested fixed position local regions.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

FIG. 5 illustrates a sequence of records (a partial protocol stream) from an example of XML document compression.

DETAILED DESCRIPTION

Overview

Figure 1:
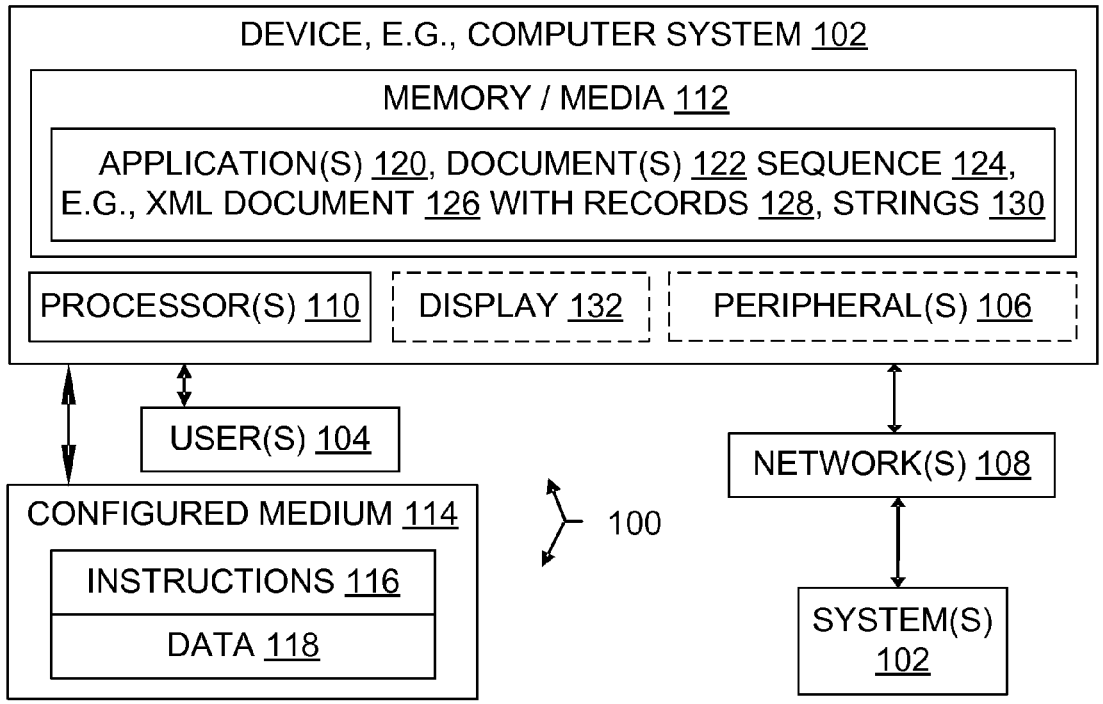
FIG. 1 is a block diagram illustrating a computer system having at least one processor, at least one memory, at least one document subject to compression, and other items in an operating environment which may be present on multiple network nodes, and also illustrating configured storage medium embodiments.

XML (eXtensible Markup Language) and XML-based mechanisms such as Simple Object Access Protocol (SOAP) can be used to facilitate web services. Through the exchange of XML-related messages, for example, web services can describe their capabilities and allow other services, applications or devices to easily invoke those capabilities. One familiar use of XML is the exchange of data between different entities, such as client and server computers, in the form of requests and responses. The contents of these requests and responses are in the form of XML documents, namely, sequences of characters that comply with the specification of XML. For example, SOAP provides an open and extensible way for applications to communicate over the web using XML-based messages, regardless of what operating system, object model, or language the particular applications may use.

XML syntax supports definition of tags and of structural relationships between tags. XML documents can impose constraints on storage layout and logical structure, while still providing great flexibility in message content. In an XML document, start and end tags can be nested within other start and end tags, defining a tree-like structure of XML elements. Subtrees in which start and end tags match up delimit well-formed regions of the XML document. An XML infoset is an abstract representation of an XML document. An infoset includes information items, and can be viewed as the information content of the XML document, without restriction on the document's format.

For transmission or storage, textual XML can be encoded into bytes that represent the corresponding text. Some text conversion standards include ASCII Unicode, UTF8 and UTF16. An in-memory representation of an XML infoset can be serialized into a textual XML string. Then the characters of the textual string can be encoded into corresponding bytes for transmission. In the reverse process, the received textual-related XML bytes are decoded into the corresponding textual XML string, which is de-serialized and stored to provide an in-memory representation of the XML infoset. The in-memory representation of an XML infoset exists logically, but need not exist physically as XML data prior to serialization.

Although XML information items can be easily serialized in this manner, and provide human-legible text, as a practical matter such serialized documents can be verbose and inefficient for processing. In some cases, accordingly, various now familiar approaches are used to serialize XML documents into a binary format, e.g., through use of a dictionary that associates information items with binary-data unit identifiers. The identifiers may identify known strings, repeated strings, repeated structures, primitive types, and/or constructs, for example. Some approaches to binary XML use static and/or dynamic dictionaries. Some approaches trade the human readability and verbosity of standard XML for improvements in serialized document size, parsing, and generation speed. Some reduce or eliminate redundant information in an XML encoding/decoding process. As with compression generally, however, the resources and objectives pertaining to XML compression in conjunction with binary encoding may differ according to the circumstances, so having a variety of possible approaches can be helpful.

Some embodiments described herein may be viewed in a broader context. For instance, concepts such as compression, tables, scope, and identifiers may be relevant to a particular embodiment. However, it does not follow from the availability of a broad context that exclusive rights are being sought herein for abstract ideas; they are not. Rather, the present disclosure is focused on providing appropriately specific embodiments. Other media, systems, and processes involving compression, tables, scope, and/or identifiers are outside the present scope. Accordingly, vagueness and accompanying proof problems are also avoided under a proper understanding of the present disclosure.

Some embodiments described herein provide compression and/or decompression which employs local and global string tables in conjunction with a binary record format for encoding/decoding XML documents. Document producers are able to nominate strings on-the-fly for replacement by efficient token values for a local document region, without requiring prior coordination with the consumer of the encoded document. Within the local regions, which may be named or hierarchically scoped, uses of the nominated string are replaced by the token value (identifier). String tables may be purged at region boundaries to reduce their memory use and encourage an increased number of nominations. Consumers apply a corresponding approach to replace the token values with the strings they identify.

Some embodiments dynamically create a local coding region with boundaries determined by the producer. Some support hierarchical nesting of region scopes. Some allow creation of alternately named regions, known as channels, for purposes such as frequency-based storage of strings. Some embodiments interleave global static, global dynamic, and local region tokens in a flat token value space. Other variations are also described herein.

Reference will now be made to exemplary embodiments such as those illustrated in the drawings, and specific language will be used herein to describe the same. But alterations and further modifications of the features illustrated herein, and additional applications of the principles illustrated herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage, in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventor asserts and exercises his right to his own lexicography. Terms may be defined, either explicitly or implicitly, here in the Detailed Description and/or elsewhere in the application file.

As used herein, a "computer system" may include, for example, one or more servers, motherboards, processing nodes, personal computers (portable or not), personal digital assistants, cell or mobile phones, other mobile devices having at least a processor and a memory, and/or other device(s) providing one or more processors controlled at least in part by instructions. The instructions may be in the form of firmware or other software in memory and/or specialized circuitry. In particular, although it may occur that many embodiments run on workstation or laptop computers, other embodiments may run on other computing devices, and any one or more such devices may be part of a given embodiment.

A "multithreaded" computer system is a computer system which supports multiple execution threads. The term "thread" should be understood to include any code capable of or subject to synchronization, and may also be known by another name, such as "task," "process," or "coroutine," for example. The threads may run in parallel, in sequence, or in a combination of parallel execution (e.g., multiprocessing) and sequential execution (e.g., time-sliced). Multithreaded environments have been designed in various configurations. Execution threads may run in parallel, or threads may be organized for parallel execution but actually take turns executing in sequence. Multithreading may be implemented, for example, by running different threads on different cores in a multiprocessing environment, by time-slicing different threads on a single processor core, or by some combination of time-sliced and multi-processor threading. Thread context switches may be initiated, for example, by a kernel's thread scheduler, by user-space signals, or by a combination of user-space and kernel operations. Threads may take turns operating on shared data, or each thread may operate on its own data, for example.

A "logical processor" or "processor" is a single independent hardware thread-processing unit. For example a hyper-threaded quad core chip running two threads per core has eight logical processors. Processors may be general purpose, or they may be tailored for specific uses such as graphics processing, signal processing, floating-point arithmetic processing, encryption, I/O processing, and so on.

A "multiprocessor" computer system is a computer system which has multiple logical processors. Multiprocessor environments occur in various configurations. In a given configuration, all of the processors may be functionally equal, whereas in another configuration some processors may differ from other processors by virtue of having different hardware capabilities, different software assignments, or both. Depending on the configuration, processors may be tightly coupled to each other on a single bus, or they may be loosely coupled. In some configurations the processors share a central memory, in some they each have their own local memory, and in some configurations both shared and local memories are present.

"Kernels" include operating systems, hypervisors, virtual machines, BIOS code, and similar hardware interface software.

"Code" means processor instructions, data (which includes constants, variables, and data structures), or both instructions and data.

"Program" is used broadly herein, to include applications, kernels, drivers, interrupt handlers, libraries, and other code written by programmers (who are also referred to as developers).

"Automatically" means by use of automation (e.g., general purpose computing hardware configured by software for specific operations discussed herein), as opposed to without automation. In particular, steps performed "automatically" are not performed by hand on paper or in a person's mind; they are performed with a machine. However, "automatically" does not necessarily mean "immediately".

Throughout this document, use of the optional plural "(s)" means that one or more of the indicated feature is present. For example, "table(s)" means "one or more tables" or equivalently "at least one table".

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as "transmitting", "sending", "issuing", "creating", "nominating", "placing", "including", "inserting", or "communicating" with regard to a destination may involve intervening action such as forwarding, copying, uploading, downloading, encoding, decoding, compressing, decompressing, encrypting, decrypting and so on by some other party, yet still be understood as being performed directly by the party of interest.

Whenever reference is made to data or instructions, it is understood that these items configure a computer-readable memory thereby transforming it to a particular article, as opposed to simply existing on paper, in a person's mind, or as a transitory signal on a wire, for example.

Operating Environments

With reference to FIG. 1, an operating environment 100 for an embodiment may include computer system(s) 102, and in particular may include two or more computer systems 102 which communicate using XML and/or other structured documents. A given computer system 102 may be a multiprocessor computer system, or not. An operating environment may include one or more machines in a given computer system, which may be clustered, client-server networked, and/or peer-to-peer networked.

Human users 104 may interact with the computer system 102 by using displays, keyboards, and other peripherals 106. System administrators, developers, engineers, and end-users are each a particular type of user 104. Automated agents acting on behalf of one or more people may also be users 104. Storage devices and/or networking devices may be considered peripheral equipment in some embodiments. Other computer systems not shown in FIG. 1 may interact with the computer system(s) 102 or with another system embodiment, by using one or more connections to a network 108 via network interface equipment, for example.

The computer system 102 includes at least one logical processor 110. The computer system 102, like other suitable systems, also includes one or more computer-readable non-transitory storage media 112. Media 112 may be of different physical types. The media 112 may be volatile memory, non-volatile memory, fixed in place media, removable media, magnetic media, optical media, and/or of other types of non-transitory media (as opposed to transitory media such as a wire that merely propagates a signal). In particular, a configured medium 114 such as a CD, DVD, memory stick, or other removable non-volatile memory medium may become functionally part of the computer system when inserted or otherwise installed, making its content accessible for use by processor 110. The removable configured medium 114 is an example of a computer-readable storage medium 112. Some other examples of computer-readable storage media 112 include built-in RAM, ROM, hard disks, and other storage devices which are not readily removable by users 104.

The medium 114 is configured with instructions 116 that are executable by a processor 110; "executable" is used in a broad sense herein to include machine code, interpretable code, and code that runs on a virtual machine, for example. The medium 114 is also configured with data 118 which is created, modified, referenced, and/or otherwise used by execution of the instructions 116. The instructions 116 and the data 118 configure the medium 114 in which they reside; when that memory is a functional part of a given computer system, the instructions 116 and data 118 also configure that computer system. In some embodiments, a portion of the data 118 is representative of real-world items such as product characteristics, inventories, physical measurements, settings, images, readings, targets, volumes, and so forth. Such data is also transformed by compression/decompression as discussed herein, e.g., by creating/deleting and using a local string table, nesting, replacing, inserting, binding, deployment, execution, modification, display, creation, loading, and/or other operations.

Application(s) 120 generate, send, receive, and/or otherwise utilize document(s) 122, that is, a sequence 124 of one or more documents 122. Documents 122 may include XML documents 126 with constituent records 128 and constituent strings 130, for example. Applications 120, documents 122, and other items shown in the Figures and/or discussed in the text may reside partially or entirely within one or more media 112, thereby configuring those media. In addition to the processor(s) 110 and memory 112, an operating environment may also include other hardware, such as a display 132, buses, power supplies, and accelerators, for instance. Some operating environments include a version of a Microsoft®.Net Framework environment (mark of Microsoft Corporation).

One or more items are shown in outline form in FIG. 1 to emphasize that they are not necessarily part of the illustrated operating environment, but may interoperate with items in the operating environment as discussed herein. It does not follow that items not in outline form are necessarily required, in any Figure or any embodiment.

Systems

Figure 2:
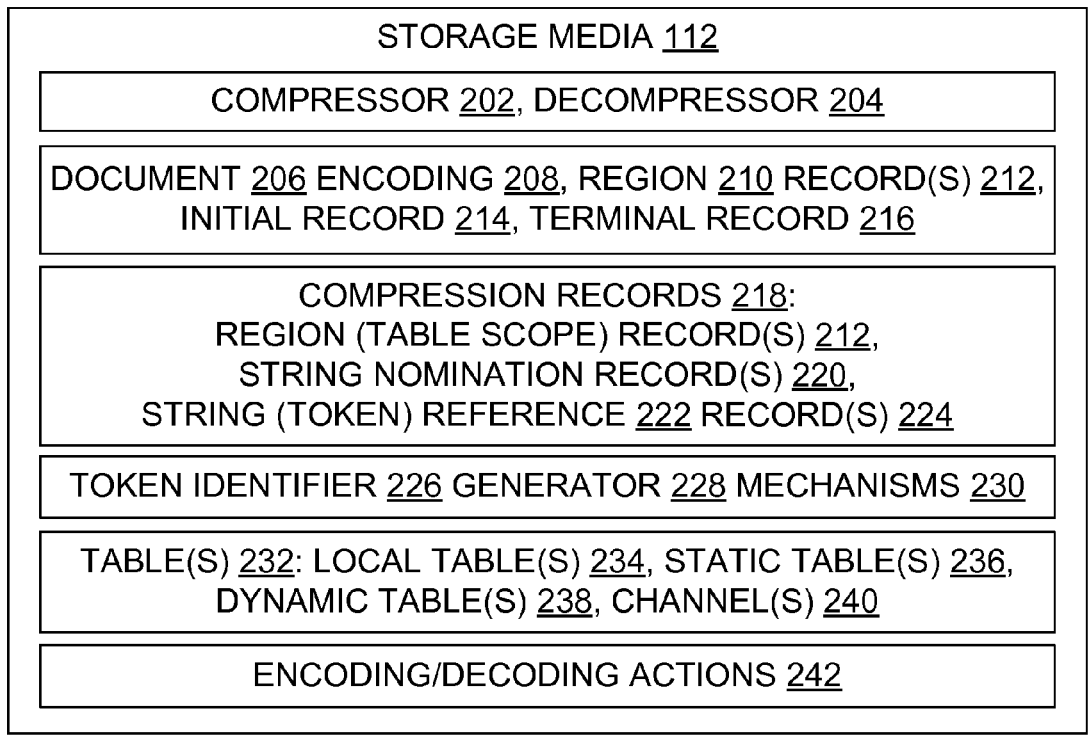
FIG. 2 is a block diagram illustrating compression using local tables, in an example architecture.

FIG. 2 illustrates an architecture which is suitable for use with some embodiments. The illustrated architecture includes both a compressor 202 and a decompressor 204, but in some embodiments only a compressor 202 is present, and in some only a decompressor 204 is present. The compressor 202 and decompressor 204 generate, send, receive and/or decode encodings 208 of documents 206. Partially or fully compressed documents 206 are designated herein as document(s) 206 rather than documents 122 or documents 126, to reflect the presence in a document 206 of at least partial compression by a compressor 202. A given document 206 has an initial record 214 and a terminal record 216, namely, the initial record of the document that will be encountered by the decompressor, and the final record of the document that will be encountered by the decompressor, respectively.

In some embodiments, documents 206 have regions 210 indicated by records 212. Regions 210 do not necessarily correspond with well-formed regions of the original unencoded documents 122, 126. Regions 210 may have lifespans that are not coextensive with a given compression or decompression process performed on the document. Rather, the regions 210 correspond in scope to local tables 234 which are created, used, and deleted as part of the compression process and as part of the decompression process.

In some embodiments, documents 206 contain compression records 218. Some examples of compression records 218 include region 210 demarcation records 212, string nomination records 220, and records 224 which contain string references 222. In some embodiments, documents 206 are implemented using a mix of familiar records 128 and compression records 218. Examples of familiar records 128 include records which merely denote XML element boundaries or merely indicate some other familiar encoding/decoding action 242. Token identifiers 226 in compression records 218 are provided by a token identifier generator 228 which uses one or more token identifier generation mechanisms 230. Token identifiers 226 identify tokenized strings 130, e.g., by explicitly or implicitly identifying a table 232 of string tokens and a particular entry within that table. In addition to local tables 234, some embodiments utilize familiar static table(s) 236 and/or dynamic table(s) 238. Some embodiments also utilize channels 240, in the form of multiple local tables 234, multi-channel local table(s) 234, or both, for example.

With reference to FIGS. 1 and 2, some embodiments provide a computer system 102 with a logical processor 110 and a memory medium 112 configured by circuitry, firmware, and/or software to transform a document 122, 126 by compression or to transform a document 206 by decompression, as described herein. The memory 112 is in operable communication with the logical processor 110. A token identifier generator 228 is configured to generate string token identifiers 226.

In some embodiments, a document encoding 208 includes a sequence of compressed automatically parsable document(s) 206 residing in the memory and having records which include at least one local string nomination region record 212 nominating a fixed position local region 210 of the records as a region within which a local table 234 of strings is alive. The local region 210 is smaller than the entire document encoding 208. The local region 210 is fixed in position relative to an initial record 214 of the document(s) rather than sliding; the region 210 (and hence the lifespan of the region's local table(s) 234), is not a sliding window. Thus, in some embodiments a local table 234 is "local" because its life is a proper subset of the life of the document encoding, unlike the life of static tables 236 and dynamic tables 238. In some, a local table 234 is "local" because it is in a local region 210 that is not aligned with any well-formed region of the unencoded document 122, e.g., not aligned with any portion of the original document 126 that is well-formed (matching element bounds) under XML syntax. In some embodiments, local region 210 boundaries can be marked explicitly (by records 212, such as records to push or pop local table scope) or implicitly, whereas in other embodiments all region boundary indications are of a single kind (all implicit, or all explicit).

In some embodiments, the document encoding 208 includes two or more hierarchically nested fixed position local regions 210. The records also include at least one string nomination record 220 within the local region which nominates a string for inclusion in the local table 234. The records also include at least one local string reference record 224 containing a token identifier as a reference 222 which identifies an entry of the local string table.

Some embodiments include a document compressor 202 which is configured to generate the compressed automatically parsable document(s) in conjunction with the token identifier generator 228. Some include a document decompressor 204 which is configured to decompress the compressed automatically parsable document(s) in conjunction with the token identifier generator 228. The document 206 may be produced by compressing an XML document 126, for example.

In some embodiments, the document encoding 208 includes the local table 234, as well as a static table 236 and a dynamic table 238. In some, the tables all share a single flat token value space. In other embodiments, different kinds of tables have different respective token value spaces. In some embodiments, the document encoding 208 includes multiple channels 240 in a partitioned identifier space. In some embodiments, a local table 234 has multiple channels 240, string insertion to the local table explicitly names which channel to use, and different channels are chosen based on expected or actual frequency of string references 222.

In some embodiments, a document encoding 208 includes one or more (e.g., at least two, at least three, etc.) of the following local string nomination records 220: a record 220 nominating a string recited in the record, a record 220 nominating the next string seen by the decompressor, a record 220 nominating the most recently seen string, a record 220 nominating all of the string(s) used by the next record (of any type, or of a particular specified or default type), a record 220 nominating all of the string(s) used by the previous record, a record 220 nominating a string and also specifying an encoding action 242.

In some embodiments peripherals 106 such as human user I/O devices (screen, keyboard, mouse, tablet, microphone, speaker, motion sensor, etc.) will be present in operable communication with one or more processors 110 and memory. However, an embodiment may also be deeply embedded in a system, such that no human user 104 interacts directly with the embodiment. Software processes may be users 104.

In some embodiments, the system includes multiple computers connected by a network. Networking interface equipment can provide access to networks 108, using components such as a packet-switched network interface card, a wireless transceiver, or a telephone network interface, for example, will be present in a computer system. However, an embodiment may also communicate through direct memory access, removable nonvolatile media, or other information storage-retrieval and/or transmission approaches, or an embodiment in a computer system may operate without communicating with other computer systems.

Some embodiments operate in a "cloud" computing environment and/or a "cloud" storage environment. For example, a compressor 202 may be on one device/system 102 in a networked cloud, a decompressor 204 may be on another device/system within the cloud, and the compressed documents 206 may configure the memory on these and other cloud device(s)/system(s) 102, such as intervening server computers, routers, bridges, and so on.

Processes

Figure 3:
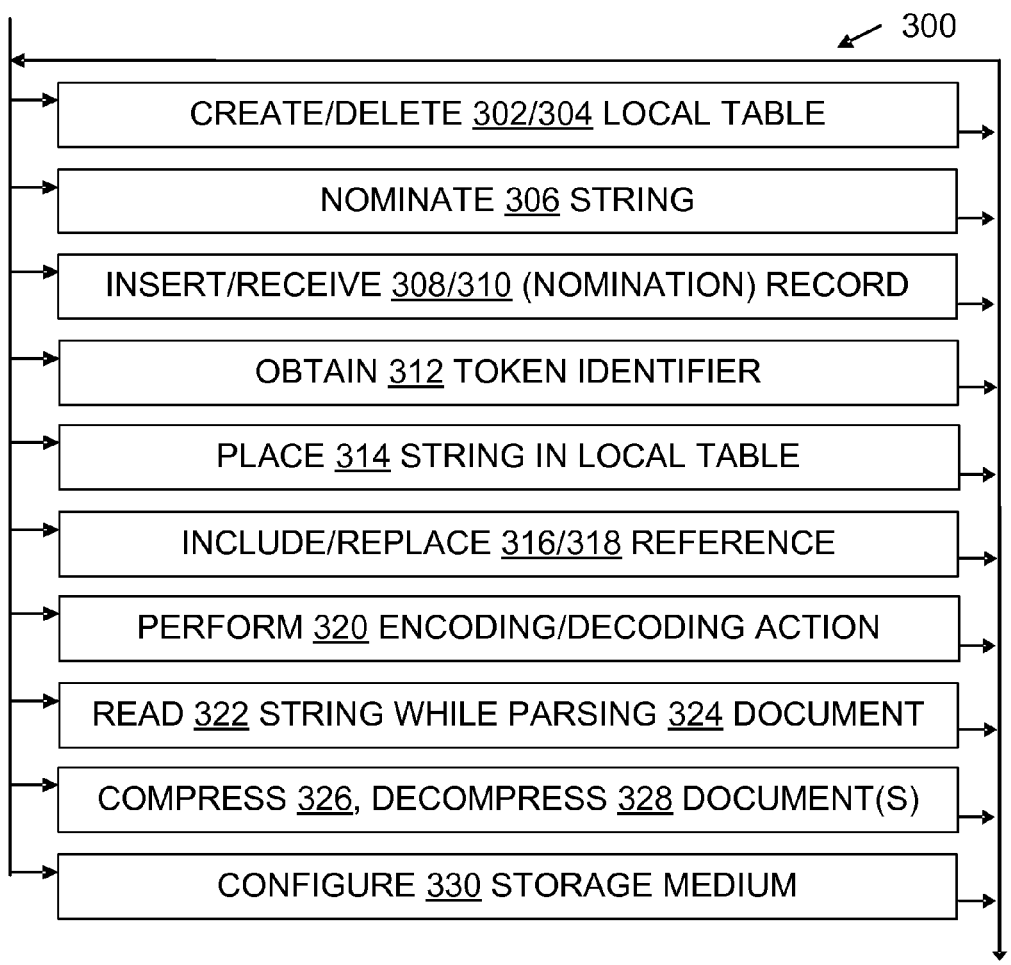
FIG. 3 is a flow chart illustrating steps of some process and configured storage medium embodiments.

FIG. 3 illustrates some process embodiments in a flowchart 300. Processes shown in the Figures may be performed in some embodiments automatically, e.g., by a compressor 202 and/or decompressor 204 under control of an application, a network stack, or a kernel. Processes may also be performed in part automatically and in part manually unless otherwise indicated. In a given embodiment zero or more illustrated steps of a process may be repeated, perhaps with different parameters or data to operate on. Steps in an embodiment may also be done in a different order than the top-to-bottom order that is laid out in FIG. 3. Steps may be performed serially, in a partially overlapping manner, or fully in parallel. The order in which flowchart 300 is traversed to indicate the steps performed during a process may vary from one performance of the process to another performance of the process. The flowchart traversal order may also vary from one process embodiment to another process embodiment. Steps may also be omitted, combined, renamed, regrouped, or otherwise depart from the illustrated flow, provided that the process performed is operable and conforms to at least one claim.

Examples are provided herein to help illustrate aspects of the technology, but the examples given within this document do not describe all possible embodiments. Embodiments are not limited to the specific implementations, arrangements, displays, features, approaches, or scenarios provided herein. A given embodiment may include additional or different features, mechanisms, and/or data structures, for instance, and may otherwise depart from the examples provided herein.

During a local table creating step 302, an embodiment creates a local table 234. Step 302 may be accomplished using programming language data structures, memory managers, runtimes, and/or other familiar mechanisms, for example, adapted by/for use in creating local tables 234 as described herein and differentiated from other tables 232.

During a local table deleting step 304, an embodiment deletes a local table 234. Step 304 may be accomplished by actually releasing table 234 memory back to the kernel or runtime, for example, or by managing memory locally within the compressor 202/decompressor 204 and "deleting" the local table 234 by treating its content as invalid and its space as available for reuse. Deleting is sometimes called purging herein.

During a string nominating step 306, an embodiment nominates a string 130 for entry in a local table 234. String nomination may be effected in various ways by records 220, as noted herein, e.g., by specifying strings in prior or upcoming records or XML elements, or given number of prior or upcoming records, as nominated string(s).

During a nomination record inserting step 308, an embodiment inserts string nomination record(s) 220 or region records 212 in a stream of records while compressing a document. Likewise, copies of original data records 128 may be created and inserted 308 during compression of a document.

During a record receiving step 310, an embodiment receives a nomination record 220 which identifies a nominated string and/or a region record 212 identifying a region 210. Other record receiving steps are also denoted as step 310 herein, e.g., receiving 310 a familiar record 128. Step 310 may be accomplished using network transmission, file system reads, RAM access, and/or other familiar mechanisms adapted by virtue of acting upon nomination record(s) 220 and/or region records 212, for example.

During a token identifier obtaining step 312, also referred to as generating step 312, an embodiment generates or otherwise obtains a token identifier 226. Token identifiers generated 312 during compression of a given document 122 should match the token identifiers generated during decompression of that document, that is, the sequence of identifiers 226 is shared by the compression and the decompression for a given document. Token generators 228 may be implemented by code inside a compressor 202 and other code inside a decompressor 204. However, token identifier generation 312 can also be viewed as a logically distinguishable part of compression and (likewise) of decompression, as suggested by FIG. 2, and thus a system could be implemented in which a compressor 202 and a decompressor 204 both use the same code to generate 312 token identifiers 226. A given shared sequence of token identifiers 226 may be generated 312 using familiar mechanisms 230 such as a successor function, a hash function, or a user-defined identifier, adapted by virtue of their use in the specific compression and/or decompression processes taught herein.

During a string placing step 314, an embodiment places a tokenized string in a local table 234. The string is recorded in the table in correspondence with a token identifier 226 that is (or was) generated or otherwise obtained 312 to identify the string that is being placed 314.

During a reference including step 316, an embodiment includes a reference 222 (such as a token identifier 226 in a reference record 224) in a compression of a document, rather than including a complete copy of the string, as was present in the original document 122.

During a reference replacing step 318, an embodiment replaces a reference 222 (such as a token identifier 226 in a reference record 224) in a compression of a document with a complete copy of the referenced string, which is read 322 from the local table using the token identifier while parsing 324 a document.

During an action performing step 320, an embodiment performs an encoding or decoding action 242, such as implementing an XML element start or end in the form of a record 128.

During a string reading step 322, a string is read while parsing 324 a document. Parsing may explicitly or implicitly recognize that a region 210 is a fragment with regard to the original document's syntax, e.g., under SOAP or XML syntax. Implicit recognition occurs when parsing results in or utilizes a region 210 that is not well-formed in terms of XML start-end tag pairs, for example. Reading 322 may be done using file systems, memory accesses, and other familiar mechanisms, for example, which have been adapted to recognize and process compression records 218 and to otherwise perform as taught herein. Parsing 324 may be accomplished using lexical analysis, pointers, syntactic and semantic analysis, and other familiar mechanisms, for example, which have been adapted to recognize and process compression records 218 and to otherwise perform as taught herein.

During a compressing step 326, an embodiment compresses a document 122, using steps such as creating 302, deleting 304, nominating 306, inserting 308, obtaining 312, placing 314, and/or including 316, for example.

During a decompressing step 328, an embodiment decompresses a document 206, using steps such as creating 302, deleting 304, receiving 310, obtaining 312, placing 314, and/or replacing 318, for example.

During a memory configuring step 330, a memory medium 112 is configured by a compressed or partially compressed document 206, a local table 234, compression record(s) 218, or otherwise in connection with locally scoped compression of binary documents as discussed herein.

The foregoing steps and their interrelationships are discussed in greater detail below, in connection with various embodiments.

Some embodiments provide a process for compressing a document to produce a document encoding. The process includes creating 302 a local table having spaces allocated for holding a plurality of strings, nominating 306 a string for inclusion in the local table, and inserting 308 at least one record in the document encoding to effect the nomination. After obtaining 312 a token identifier, the process places 314 the nominated string in the local table in correspondence with the token identifier. The process also includes 316 at least one reference to the token identifier in the document encoding.

In some embodiments, the process further includes deleting 304 the local table. In some, deleting 304 occurs after placing 314 at least two nominated strings in the local table and after including 316 in the document encoding at least two token identifier references for those strings. In some cases, the deleting 304 occurs before the document is fully compressed. More generally, a local table's lifespan may be a proper subset of a compression period if the table is created 302 after compression produces an initial record 214 (regular record 128 or compression record 218), if the table is deleted 304 before compression produces a terminal record 216, or both.

In some embodiments, prior to encoding the unencoded document 122 conforms with a syntax in which subtrees delimit well-formed regions of the unencoded document, such as an XML or SOAP syntax, for example. In some such cases, the process further includes deleting 304 the local table. In some, deleting 304 occurs after placing 314 at least two nominated strings in the local table and after including 316 in the document encoding at least two token identifier references for those strings, as noted above, and the creating and deleting of the local table demarcate a region 210 of the document 206 which fails to match any well-formed region of the unencoded document 122. That is, the local table scope matches a local region that is not aligned with any syntactically well-formed region of the unencoded document, because such alignment is not required.

In some embodiments, the process creates 302 a local table having multiple channels 240. In some, the process places 314 the nominated string in a selected channel of the local table based at least in part on an expected frequency of references to the nominated string. More generally, multiple channels may be provided by a single local table, such that the channels all have the same lifespan (the table's lifespan), and/or multiple channels may be provided by a multiple local tables which have different respective lifespans.

In some embodiments, the process inserts 308 at least one of the following records in the document encoding to effect a nomination: a record nominating the next string seen, a record nominating the most recently seen string, a record nominating all of the string(s) used by the next record, a record nominating all of the string(s) used by the previous record, a record for nominating a string and contemporaneously performing an encoding action.

In some embodiments, the step of nominating 306 a string for inclusion in the local table is preceded by reading 322 the string while parsing 324 an XML document 126.

Some embodiments provide a process for decompressing a document encoding. The process includes creating 302 a local table having spaces allocated for holding a plurality of strings, receiving 310 at least one record which indicates that a string nomination occurred during creation of the document encoding, obtaining 312 a token identifier, placing 314 the nominated string in the local table in correspondence with the token identifier, replacing 318 at least one reference to the token identifier in the document encoding by an instance of the nominated string, and deleting 304 the local table after the replacing step. The process may produce a decompressed XML document, for example.

Some embodiments use only local table(s) 234, while others also static table(s) and/or dynamic table(s). Some embodiments accordingly further include replacing a reference in a compressed document by an instance of a string which is read from a static table or from a dynamic table, rather than being read from the local table.

In some embodiments, the creating and deleting of the local table demarcate a region 210 of a compressed document 206 which fails to match any well-formed region of the document under XML syntax after decompression.

In some embodiments, the process decompresses 328 a single compressed document, the local table creating step 302 occurs after receiving 310 an initial record 214 of the compressed document, and the local table deleting step 304 occurs before receiving a terminal record 216 of the compressed document. Thus, the life (scope) of the local table is a proper subset of the decompression period.

Some embodiments use hierarchically nested local regions 210 in document encodings. For example, in some the local table is a first local table, the process also includes creating a second local table and deleting the second local table, and the creating and deleting steps occur in the following relative order: creating the first local table, creating the second local table, deleting the second local table, deleting the first local table.

A given record may serve more than one role. In some embodiments, for example, the receiving step 310 receives a record for both nominating a string and contemporaneously performing a decoding action.

Figure 4:
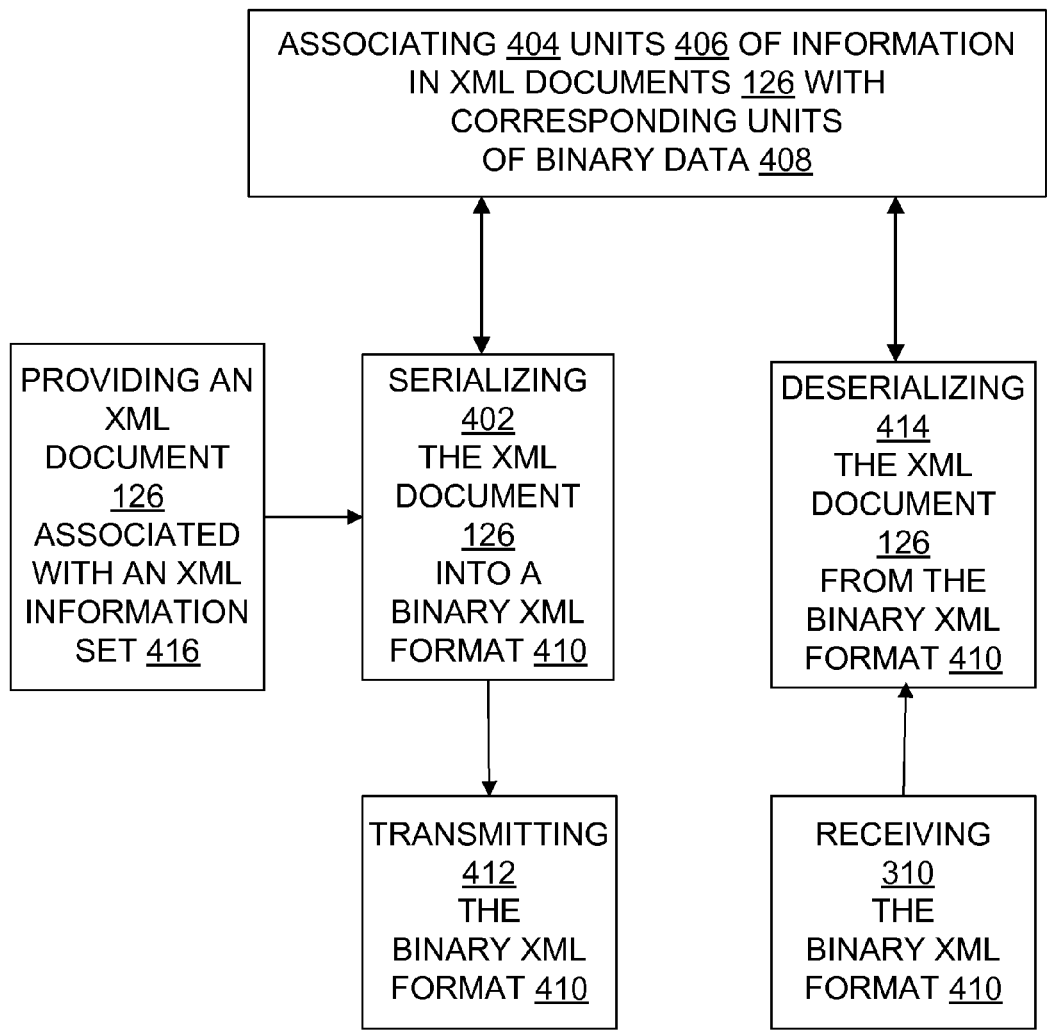
FIG. 4 is a data flow diagram further illustrating some embodiments, with particular attention to XML document compression.

FIG. 4 illustrates a general data flow for serializing 402 and deserializing 414 XML documents with a binary XML format 410. The initial XML information set 416 exists logically but may not exist physically. That is, the information units 406 comprising the document need not exist in any physical location prior to serialization. The serialization 402 of an XML document produces associations 404 between information units 406 and binary data 408 in the form of bindings. The lifetime of the association may be for a portion of a document, an entire document, or may even span multiple documents as agreed upon for the document format 410 used, by the producer and consumer. The serialized 402 document is transmitted 412 to the consumer, using a network 108 for example. The deserialization 414 of an XML document similarly may produce associations 404 between information units and binary data. The associations may be shared from serialization to deserialization but typically would probably be recreated as needed to avoid having to durably store and exchange them.

In particular, the serialization 402 may in some cases include compression 346 as taught here, deserialization 414 may include decompression 348, and the format 410 may be compatible with a document 206 having regions 210 and local tables 234 (pursuant to compression records 218, for example), according to the teachings provided herein.

Configured Media

Some embodiments include a configured computer-readable storage medium 112. Medium 112 may include disks (magnetic, optical, or otherwise), RAM, EEPROMS or other ROMs, and/or other configurable memory, including in particular non-transitory computer-readable media (as opposed to wires and other propagated signal media). The storage medium which is configured may be in particular a removable storage medium 114 such as a CD, DVD, or flash memory. A general-purpose memory, which may be removable or not, and may be volatile or not, can be configured into an embodiment using items such as a compressor 202, a decompressor 204, a partially or fully compressed document 206, and/or a local table 234, in the form of data 118 and instructions 116, read from a removable medium 114 and/or another source such as a network connection, to form a configured medium. The configured medium 112 is capable of causing a computer system to perform process steps for transforming data through compression and/or decompression as disclosed herein. FIGS. 1 through 4 thus help illustrate configured storage media embodiments and process embodiments, as well as system and process embodiments. In particular, any of the process steps illustrated in FIG. 3, or otherwise taught herein, may be used to help configure a storage medium to form a configured medium embodiment.

Additional Examples

Additional details and design considerations are provided below. As with the other examples herein, the features described may be used individually and/or in combination, or not at all, in a given embodiment.

Those of skill will understand that implementation details may pertain to specific code, such as specific APIs and specific sample programs, and thus need not appear in every embodiment. Those of skill will also understand that program identifiers and some other terminology used in discussing details are implementation-specific and thus need not pertain to every embodiment. Nonetheless, although they are not necessarily required to be present here, these details are provided because they may help some readers by providing context and/or may illustrate a few of the many possible implementations of the technology discussed herein.

Consider the following short XML document fragment that spells out a common portion of messages enveloped using the SOAP protocol for exchange by web services.
<s:Envelope xmlns:s="http://www.w3.org/2003/05/soap-envelope"></s:Envelope>

The domain name and other address information in this XML document is meant solely as an example, and in particular is not intended to incorporate by reference any information located outside the present patent document. The same is also true of all other instances of domain names in this patent document.

One way to represent this XML document is by coding each of the characters in the document using a textual character set representation. For example, in ASCII the character '<' is 0x3C, the character 's' is 0x73, and so on.

A more compact representation of the same XML document may be obtained by coding the document using structurally semantic records. For example, a byte sequence may be defined that represents an XML element, an XML attribute, and so on, combined with the ability to describe a standard set of primitive types.

As an example, the above XML document may be represented with the following sequence of records:
StartElement
ElementName 'Envelope'
ElementPrefix 's'
DeclareNamespace
NamespaceName 's'
NamespaceValue 'http://www.w3.org/2003/05/soap-envelope'
End Element Various record formats may be chosen to improve the coding efficiency of the binary format. For example, if the sequence of StartElement and ElementPrefix records was particularly common it might be combined into a single StartElementPrefixedWithS record if this combination were particularly common.

As another example, if the string 'Envelope' appears frequently it may be more efficient to replace the string literal with a previously agreed upon token value. If both the producer and consumer agree to represent 'Envelope' with token #2, then the element name record might instead be coded as:
ElementTokenizedName 2
where ElementTokenizedName is a distinct byte sequence and record type from ElementName. The string represented by token #2 can then be looked up in a table of string-token values.

Some methods for agreeing to represent a string with a token are (a) programming both the producer and consumer with knowledge of the tokens (a static global table), (b) exchanging string tables prior to the delivery of the message (a dynamic global table), and (c) automatically promoting strings to a string table according to an algorithmic process (another kind of dynamic global table). The algorithmic process may be for example to add every seen string less than a fixed size to the table.

In some embodiments described herein, however, the producer is able to dynamically create and manage string tables to code strings more efficiently.

By way of further illustration, first consider the use of a single local table 234. The local table is initially empty. One process includes the following. The producer nominates 306 a string for inclusion in the local table. The producer inserts 308 one or more records to the document to effect the nomination. For example, a nomination might be indicated by a record type for nominating a string, a record type for nominating the next one or more seen strings (for example, an AddNextString record preceding a StartElement 'element' record would nominate the string 'element' in addition to its immediate use), a record type for nominating the most recently one or more seen strings (for example, a StartElement 'element' record preceding an AddPreviousString record), a record type for nominating all of the strings used by the next or previous record, or a record type for nominating a string and simultaneously performing an action (for example, StartElementAndAddString 'element' would as a side effect nominate the string 'element').

Continuing this process, the producer places 314 the nominated string in its local table with the next available token identifier 226. The producer includes 316 one or more records in the document 206 referring to the token identifier. The coded document 206 is transferred from the producer to the consumer.

The consumer receives 310 one or more records 220 indicating the nomination. The consumer receives 310 one or more records 218 indicating the contents of the nominated string. The consumer receives 310 one or more records 224 referring to the string via the token identifier. The consumer places 314 the nominated string to its own local table 234 with the next available token identifier 226, which will be generated to match the identifier used during compression by the producer. The consumer replaces 318 the token identifier with the nominated string.

Note that the different nomination mechanisms can induce different orderings of the consumer's aforementioned receiving steps, which can have varying implementation complexities. Accordingly, some embodiments nominate 306 a string before or contemporaneously with indicating the string's contents. Frequently used actions may have a contemporaneous nomination while infrequently used actions may have a prior nomination, as limiting the number of record types may improve the efficiency for coding the record type field. When the use of a particular set of strings is localized, regions 210 may be used to denominate strings at a later time. Removing strings from tables may be beneficial, for example to reduce the storage space required and time spent searching.

Similar to nominations, the start of a region 210 may be indicated by records 212, before, simultaneously with, or subsequent to encountering the region boundary. The region 210 start boundary may be marked by an explicit indication or implicitly by a structural element in the document (for example, the start of an XML element). At the region start boundary a water mark is placed in the table 234 to indicate where the region began (a local table may be a portion of a larger table which is dedicated for use as a local table during the life of the local table, or may be a physically separate data structure). The region end boundary may similarly be marked by an explicit or implicit indication. In some embodiments the region start and end boundaries are both explicit or both implicit, while in other embodiments a region may explicitly start and implicitly end, for example. When the region end boundary is reached, all strings back to the water mark are removed, resetting the next available token identifier 226.

Now consider the use of more than one table 232, some of which may be static global tables 236, others dynamic global tables 238, and still others local tables 234. Each nomination and reference will reference into a particular one of the tables. For example, rather than referencing the token #2, the reference may indicate token #2 in table #3. This double reference may comprise two identifier fields in the record 224 supplying the reference or may make use of a separate record type for indicating the table in addition to the record for making the reference.

Some embodiments make the table references implicit where possible. For example, if there are multiple tables but only one local table 234, then the nomination of a string may implicitly refer to the local table. As another example, particular tables may be favored so that there is a default table for nominations and a default table for references, while other tables require an explicit table reference. This reduces the coding size needed to support multiple tables if a particular table is frequently used. Some embodiments provide a record 218 type that sets a default table.

Finally, consider the multiplexing of more than one table inside of a flat identifier space. The identifier space is partitioned into disjoint sets (here called channels). Each channel 240 has an initial element and a successor function that produces the unique next element in the set given an input element. For example, the identifier 226 space of the non-negative integers may be partitioned into three channels $\{0, 3, 6, \ldots\}$, $\{1, 4, 7, \ldots\}$, $\{2, 5, 8, \ldots\}$, with initial elements 0, 1, and 2, and the same successor function for each channel fix-→x+3. Each table is assigned to a channel allocating token identifiers as before. FIG. 5 and the tabular figure shown below depict a protocol stream and string table illustrating this example configuration. Channels 1 and 2, a static and dynamic table respectively, have been populated with strings prior to the beginning of the illustrated protocol stream; channel 3 is a local table that is empty at the beginning of the protocol stream. The tabular figure shows string table contents before executing the pop scope operations shown at records 19 and 20 in FIG. 5.

| Tabular Figure | | | |
|---|---|---|---|
| Channel 1 (static) Token Value | Channel 2 (dynamic) Token Value | Channel 3 (local) Token Value | Mark |
| 0 Envelope | 1 Cheeses | 2 Cheddar | |
| 3 Body | 4 Variety | 5 Gouda | |
| 6 Header | 7 Age | 8 Swiss | |
| 9 (null) | 10 Subtype | 11 Yellow | X |
| | 13 (null) | 14 White | |
| | | 17 3 months | X |
| | | 20 6 months | |
| | | 23 (null) | |

The protocol stream in FIG. 5 encodes the XML fragment:
<Cheeses>
<Cheddar Variety="Yellow"></Cheddar>
<Cheddar Variety="White" Age="3 months"></Cheddar>
<Gouda></Gouda>
</Cheeses>

As another example the integers may be partitioned into two channels $\{1, 2, \ldots\}$ and $\{-1, -2, \ldots\}$ with the successor functions f:x-→x+1 and g:x-→x-1. Note that in addition to using different successor functions for each partition, in this example there are values in the identifier space left reserved rather than allocated to a channel.

A table may have multiple channels allocated to it. For example, if a multiplexed table has channels 0-7 and there are three tables to multiplex: a global static table (very frequently referenced), a first local table (less frequently referenced), and a second local table (infrequently referenced), the global static table may round robin between channels 0-4, the first local table may round robin between channels 5-6, and the second local table may have only channel 7. Thus, with a similar partitioning of non-negative integers as above, the global static table may use the token identifiers 0, 1, 2, 3, 4, 8, 9, 10, 11, 12, 16, 17, and so on. The first local table may use the token identifiers 5, 6, 13, 14, and so on. The second local table may use the token identifiers 7, 15, 23, and so on. In this way the more frequently referenced tables may monopolize favorable coding values (such as small integers).

CONCLUSION

Although particular embodiments are expressly illustrated and described herein as processes, as configured media, or as systems, it will be appreciated that discussion of one type of embodiment also generally extends to other embodiment types. For instance, the descriptions of processes in connection with FIG. 3 also help describe configured media, and help describe the operation of systems and manufactures like those discussed in connection with other Figures. It does not follow that limitations from one embodiment are necessarily read into another. In particular, processes are not necessarily limited to the data structures and arrangements presented while discussing systems or manufactures such as configured memories.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific features of an example may be omitted, renamed, grouped differently, repeated, instantiated in hardware and/or software differently, or be a mix of features appearing in two or more of the examples. Functionality shown at one location may also be provided at a different location in some embodiments.

Reference has been made to the figures throughout by reference numerals. Any apparent inconsistencies in the phrasing associated with a given reference numeral, in the figures or in the text, should be understood as simply broadening the scope of what is referenced by that numeral.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims as filed are part of the specification.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific features or acts described above the claims. It is not necessary for every means or aspect identified in a given definition or example to be present or to be utilized in every embodiment. Rather, the specific features and acts described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A computer-readable non-transitory storage medium configured with data and with instructions that when executed by at least one processor causes the processor(s) to perform a process for compressing a document to produce a document encoding, the process comprising the steps of:
   creating a local table having spaces allocated for holding a plurality of strings;
   nominating a string for inclusion in the local table after reading the string while parsing an XML document;
   inserting at least one record in the document encoding to effect the nomination;
   obtaining a token identifier;
   placing the nominated string in the local table in correspondence with the token identifier; and
   including at least one reference to the token identifier in the document encoding.

2. The configured medium of claim 1, wherein the process further comprises deleting the local table, wherein the deleting occurs after placing at least two nominated strings in the local table and after including in the document encoding at least two token identifier references for those strings, and wherein the deleting occurs before the document is fully compressed.

3. The configured medium of claim 1, wherein:
   prior to encoding, the unencoded document conforms with a syntax in which subtrees delimit well-formed regions of the unencoded document;
   the process further comprises deleting the local table;
   the deleting occurs after placing at least two nominated strings in the local table and after including in the document encoding at least two token identifier references for those strings;
   and the creating and deleting of the local table demarcate a region of the document which fails to match any well-formed region of the unencoded document.

4. The configured medium of claim 1, wherein the creating step creates a local table having multiple channels, and the placing step places the nominated string in a selected channel of the local table based at least in part on frequency of references to the nominated string.

5. The configured medium of claim 1, wherein the inserting step inserts at least one of the following records in the document encoding to effect the nomination:
   a record nominating the next string seen;
   a record nominating the most recently seen string;
   a record nominating all of the string(s) used by the next record;
   a record nominating all of the string(s) used by the previous record.

6. The configured medium of claim 1, wherein the inserting step inserts a record for nominating a string and contemporaneously performing an encoding action.

7. A process of decompressing a document encoding, namely, a sequence of previously created and compressed automatically parsable document(s) containing records, the process comprising the steps of:
   creating a local table having spaces allocated for holding a plurality of strings;
   receiving at least one record which indicates that a string nomination occurred during creation of the document encoding;
   obtaining a token identifier;
   placing the nominated string in the local table in correspondence with the token identifier;

replacing at least one reference to the token identifier in the document encoding by an instance of the nominated string; and deleting the local table after the replacing step.

8. The process of claim 7, wherein the process produces a decompressed XML document.

9. The process of claim 7, wherein the process further comprises at least one of the following:

replacing a reference in a compressed document by an instance of a string which is read from a static table rather than the local table;

replacing a reference in a compressed document by an instance of a string which is read from a dynamic table rather than the local table.

10. The process of claim 7, wherein the creating and deleting of the local table demarcate a region of a compressed document which fails to match any well-formed region of the document under XML syntax after decompression.

11. The process of claim 7, wherein the process decompresses a single compressed document, the local table creating step occurs after receiving an initial record of the compressed document and the local table deleting step occurs before receiving a terminal record of the compressed document.

12. The process of claim 7, wherein the local table is a first local table, the process further comprises creating a second local table and deleting the second local table, and the creating and deleting steps occur in the following relative order: creating the first local table, creating the second local table, deleting the second local table, deleting the first local table.

13. The process of claim 7, wherein the receiving step receives a record for nominating a string and contemporaneously performing a decoding action.

14. A computer system comprising:

a logical processor;

a memory in operable communication with the logical processor;

a document encoding, namely, a sequence of compressed automatically parsable document(s) residing in the memory and having records which include at least one local string nomination region record nominating a fixed position local region of the records as a region within which a local table of strings is alive, the local region being smaller than the entire document encoding, the local region being fixed in position relative to an initial record of the document(s) rather than sliding, the records also including at least one string nomination record within the local region which nominates a string for inclusion in the local table, and also including at least one local string reference record containing a token identifier which identifies an entry of the local string table.

15. The system of claim 14, wherein the document encoding comprises in a flat token value space the local table and at least one of: a static table, a dynamic table.

16. The system of claim 14, wherein the document encoding comprises multiple channels in a partitioned identifier space.

17. The system of claim 14, wherein the document encoding comprises at least two hierarchically nested fixed position local regions.

18. The system of claim 14, wherein the system further comprises at least one of: a compressor configured to produce the document encoding, a decompressor configured to decode the document encoding, and wherein the document encoding comprises at least three of the following local string nomination records:

a record nominating a string recited in the record;

a record nominating the next string seen;

a record nominating the most recently seen string;

a record nominating all of the string(s) used by the next record;

a record nominating all of the string(s) used by the previous record;

a record nominating a string and also specifying an encoding action.

19. The system of claim 14, wherein the document encoding encodes an XML document and also comprises at least two of the following local string nomination records:

a record nominating a string recited in the record;

a record nominating the next string seen;

a record nominating the most recently seen string;

a record nominating all of the string(s) used by the next record;

a record nominating all of the string(s) used by the previous record;

a record nominating a string and also specifying an encoding action.

* * * * *